United States Patent
Yun

(10) Patent No.: US 9,496,010 B2
(45) Date of Patent: Nov. 15, 2016

(54) SEMICONDUCTOR DEVICE AND MEMORY SYSTEM INCLUDING THE SAME

(71) Applicant: SK hynix Inc., Icheon-si Gyeonggi-do (KR)

(72) Inventor: Jae Woong Yun, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 388 days.

(21) Appl. No.: 14/176,218

(22) Filed: Feb. 10, 2014

(65) Prior Publication Data

US 2015/0127873 A1 May 7, 2015

(30) Foreign Application Priority Data

Nov. 1, 2013 (KR) .......................... 10-2013-0131980

(51) Int. Cl.
*G06F 13/20* (2006.01)
*G11C 7/10* (2006.01)

(52) U.S. Cl.
CPC ........... *G11C 7/1084* (2013.01); *G11C 7/1006* (2013.01); *G11C 7/1096* (2013.01); *G11C 7/1048* (2013.01)

(58) Field of Classification Search
CPC . C11C 7/1084; C11C 7/1096; C11C 7/1006; C11C 7/1048

USPC .......................................................... 710/313
See application file for complete search history.

(56) References Cited

U.S. PATENT DOCUMENTS

| | | | |
|---|---|---|---|
| 7,830,728 B2 * | 11/2010 | Park | G11C 7/02 365/189.15 |
| 7,876,624 B2 | 1/2011 | Park | |
| 2011/0153939 A1 | 6/2011 | Choi | |
| 2013/0223140 A1 * | 8/2013 | Sohn | G11C 11/1675 365/158 |

* cited by examiner

*Primary Examiner* — Chun-Kuan Lee
(74) *Attorney, Agent, or Firm* — William Park & Associates Ltd.

(57) ABSTRACT

A semiconductor device and a memory system including the same are disclosed, which relate to a technology for reducing a toggle current of a global input output (GIO) of a semiconductor device configured to use a data bus inversion (DBI) scheme. The semiconductor device includes: a local input/output (LIO) line driver configured to perform inversion or non-inversion of data of a global input/output (GIO) line according to a control signal, and to output the inversion or non-inversion result to the LIO line; and an inversion processor configured to combine an inversion control signal and mat information, and output the control signal for controlling inversion or non-inversion of data to the LIO line driver.

19 Claims, 5 Drawing Sheets

SEMICONDUCTOR DEVICE AND MEMORY SYSTEM INCLUDING THE SAME

CROSS-REFERENCE TO RELATED APPLICATION

This application claims priority based upon Korean patent application No. 10-2013-0131980, filed on Nov. 1, 2013, the disclosure of which is hereby incorporated in its entirety by reference herein.

BACKGROUND OF THE INVENTION

Embodiments of the present invention relate to asemiconductor device and a semiconductorsystem including the same, and more particularly to a technology for reducing a toggle current of a global input output (GIO) of a semiconductor device configured to use a data bus inversion (DBI) scheme.

Along with the increasing degree of integration found in semiconductor memory devices, the semiconductor memory devices have also been continuously improved to increase the operation speed. In order to increase operation speeds of the semiconductor memory devices, synchronous memory devices capable of operating by synchronizing with an external clock of a memory chip have been recently proposed and developed.

A representative example of thesynchronous memory device is a single data rate (SDR) synchronous memory device that is synchronized with a rising edge of an external clock of a memory device such that one data piece can be input and/or output at one data pin during one period of the clock.

However, the SDR synchronous memory device may experience difficulty in satisfying a high-speed operation of the system. In order to solve such a problem facing the SDR synchronous memory device as so described, a double data rate (DDR) synchronous memory device capable of processing two data pieces during one clock period has been proposed.

Two contiguous data pieces are input and output through respective data input/output (I/O) pins of the DDR synchronous memory device, such that the two contiguous data pieces are synchronized with a rising edge and a falling edge of an external input clock. Therefore, although a clock frequency of the DDR synchronous memory device is not increased, the DDR synchronous memory device, as described here, may have a bandwidth that is at least two times larger than that of the SDR synchronous memory device. Accordingly, the DDR synchronous memory device can operate at a higher speed than the SDR synchronous memory device.

The DDR synchronous memory device is configured to use a multi-bit prefetching scheme capable of simultaneously processing multiple bits (multi-bit) of data pieces. The multi-bit prefetch scheme synchronizes sequentially input data pieces with a data strobe signal such that the input data pieces can be arranged in parallel to one another. Thereafter, the multi-bit prefetch scheme can simultaneously store the arranged multi-bit data pieces upon receiving a write command synchronized with an external clock signal.

The semiconductor memory device may be configured to store or output data in response to a command requested by a chipset. That is, if a data write operation is requested by the chipset, data entered through an input pad is stored in memory cells. If a data read operation is requested by the chipset, data stored in memory cells is externally output through an output pad.

Generally, a semiconductor memory device such as a double data rate synchronous DRAM (DDR SDRAM) includes a variety of circuits to perform a variety of operations. The Joint Electron Device Engineering Council (JEDEC) serves as a semiconductor standardization organization and has set forth standardized operations and circuits of semiconductor devices. Further, the semiconductor devices, as so described, must be designed on the basis of the JEDEC specification.

With the increasing development of fabrication and design technologies of semiconductor devices, the operation speed of the semiconductor devices is rapidly increasing. The semiconductor devices have been sequentially developed in the order of DDR2→DDR3→DDR4 according to operation speeds thereof. As the semiconductor devices have been sequentially developed in the order of DDR2→DDR3→DDR4, conventional circuits may disappear from use in the semiconductor devices. Alternatively, circuits needed for new operations may be added as necessary. Such circuits and the associated circuit operations have been defined in various other specifications.

For example, Cyclic Redundancy Checks (CRC) associated specifications and command/address parity associated specifications have been added to DDR4. In addition, Data Bus Inversion (DBI) associated specifications and new parameters have been added. The semiconductor device must perform operations corresponding to such specifications. Further, the semiconductor device must include circuits designed tocorrespond to the operations.

LPDDR4 receives data through a data bus during a write operation mode and loads the received data on a global input/output (GIO) line. However, assuming that data of the GIO line transitions several times by the data bus inversion (DBI) scheme, an unnecessary toggle current may be generated by the semiconductor device.

Specifically, the write driver according to the conventional art may be configured to reflect data inversion information into data. In this case, data inversion is performed once in the write driver. Next, such a data inversion is performed once more in a local input/output (I/O) line driver. As a result, data of the GIO line is unnecessarily transitioned several times, resulting in increase of unnecessary current consumption.

BRIEF SUMMARY OF THE INVENTION

Various embodiments of the present invention are directed to providing a semiconductor device and a memory system including the same that addresses one or more challenges often associated with the limitations and disadvantages of the related art.

An embodiment of the present invention relates to a technology for allowing a semiconductor device to reduce a toggle current of a global input/output (GIO) line using a data bus inversion (DBI) scheme.

In accordance with an embodiment of the present invention, a semiconductor device includes:a local input/output (LIO) line driver configured to perform inversion or non-inversion of data of a global input/output (GIO) line according to a control signal, and to output the inversion or non-inversion result to the LIO line; and an inversion processor configured to combine an inversion control signal and mat information, and to output the control signal for controlling inversion or non-inversion of data to the LIO line driver.

In accordance with another embodiment of the present invention, a memory system includes: a controller configured to provide data and address for inversion of a data bus; and a semiconductor device, wherein the semiconductor device includes: a local input/output (LIO) line driver configured to perform inversion or non-inversion of data of a global input/output (GIO) line according to a control signal, and output the inversion or non-inversion result to the LIO line; and an inversion processor configured to combine an inversion control signal and mat information, and output the control signal for controlling inversion or non-inversion of data to the LIO line driver.

It is to be understood that both the foregoing general description and the following detailed description of the present invention are exemplary and explanatory and are thus intended to provide further explanation of the invention as claimed.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1:
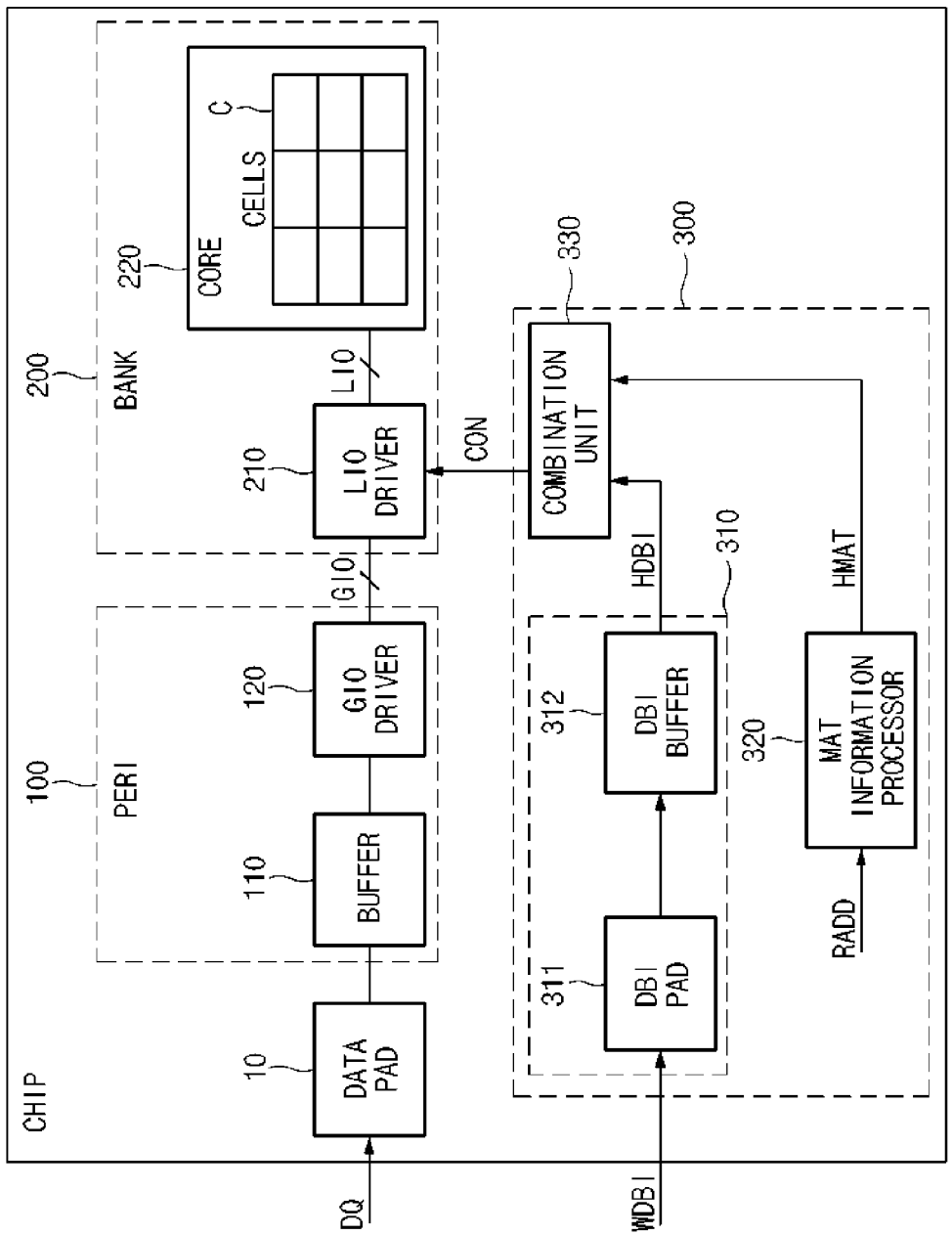
FIG. 1 is a block diagram illustrating a semiconductor device according to an embodiment.

FIG. 1 is a block diagram illustrating a semiconductor device according to an embodiment.

Referring to FIG. 1, the semiconductor device according to the embodiment includes a data pad 10, a peripheral (PERI) circuit block 100, a bank 200, and an inversion processor 300 in a chip.

Here, the data pad 10 receives data (DQ) from an external device such as a memory controller (not shown in FIG. 1). In this case, the data pad 10 is a pad on a wafer coupled to a data pin.

The peripheral circuit block 100 may include a buffer 110 and a global input/output (GIO) line driver 120. In this case, the peripheral circuit block 100 is a specific region in which circuits associated with data I/O are collected.

The buffer 110 may buffer data entered through the data pad 10. The GIO line driver (also called a GIO driver) 120 may drive data received from the buffer 110, and output the resultant data to the GIO line. The GIO line driver 120 may also include data received from the buffer 110 in the write driver for transferring the received data to the GIO line.

In addition, the bank 200 may include a local I/O (LIO) line driver 210 and a core region 220. In this case, the core region 220 may include a plurality of unit cells C. The LIO line driver (also called an LIO driver) 210 may control driving of the LIO line according to a control signal (CON) from the inversion processor 300 and data applied to the GIO line. In detail, the LIO line driver 210 may perform inversion or non-inversion of the GIO data according to a control signal (CON), and transmit the inversion or non-inversion result to the LIO line. Therefore, inversion information and mat information are reflected into output data of the LIO line driver 210 according to the control signal (CON), and the reflected result is output to the LIO line. Further, the core region 220 may store data received from the LIO line, and store the stored data in the unit cell (C).

In addition, the inversion processor 300 may output the control signal (CON) for controlling inversion or non-inversion of the LIO data. The inversion processor 300 may include a data inversion controller 310, a mat information processor 320, and a combination unit 330.

As shown here, the data inversion controller 310 receives and buffers data inversion information (WDBI), and outputs an inversion control signal (HDBI) to the combination unit 330. The data inversion controller 310 may include a data bus inversion (DBI) pad 311 and a data bus inversion buffer 312.

The inversion pad 311 may receive data inversion information (WDBI) from an external part. The memory controller transmits data (DQ) and data inversion information (WDBI) to the inversion pad 311 of the memory device, such that the memory device can determine inversion or non-inversion of data. The data bus inversion buffer 312 may buffer inversion data received from the inversion pad 311, and output an inversion control signal (HDBI) to the combination unit 330.

The mat information processor 320 may output mat information (HMAT) corresponding to an input row address (RADD) to the combination unit 330. The mat information processor 320 may output mat information selected by the row address (RADD) from among a plurality of mats to the combination unit 330.

The combination unit 330 may be configured to combine the inversion control signal (HDBI) and the mat information (HMAT), and outputs a control signal (CON) for controlling inversion or non-inversion of data to the LIO line driver 210.

The above-mentioned embodiment combines the inversion control signal (HDBI) and the mat information (HMAT) such that the LIO line driver 210 can control inversion or non-inversion of data according to the combination result. That is, the LIO line driver 210 may invert data of the LIO line only when receiving information regarding the inversion control signal (HDBI) from the selected mat.

Therefore, the number of instances in which the GIO line goes to a high voltage level during a write operation mode of the semiconductor device based on LPDDR4 specification is reduced. As a result, the above-mentioned embodiment prevents the GIO line from being transitioned to a high voltage level when the data write operation is unnecessary, such that a toggle current of the GIO line is reduced.

Figure 2:
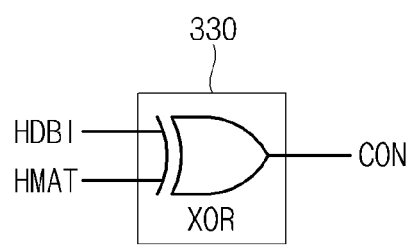
FIG. 2 is a detailed circuit diagram illustrating a combination unit shown in FIG. 1.

FIG. 2 is a detailed circuit diagram illustrating the combination unit 330 shown in FIG. 1.

Referring to FIG. 2, the combination unit 330 performs a logic operation between the inversion control signal (HDBI) and the mat information (HMAT), and outputs a control signal (CON) for controlling inversion or non-inversion of data to the LIO line driver 210. As shown here, the combination unit 330 may include a logic operation element for performing a logic operation between the inversion control signal (HDBI) and the mat information (HMAT). In detail, the combination unit 330 may include an exclusive-OR (XOR) gate for performing an XOR operation between two input signals.

Accordingly, the combination unit 330 does not invert the inversion control signal (HDBI) when the mat information (HMAT) is at a low voltage level. In detail, the combination unit 330 outputs the control signal (CON) without change. On the contrary, the combination unit 330 may invert the inversion control signal when the mat information (HMAT) is at a voltage high level, such that the combination unit 330 outputs the control signal (CON).

Figure 3:
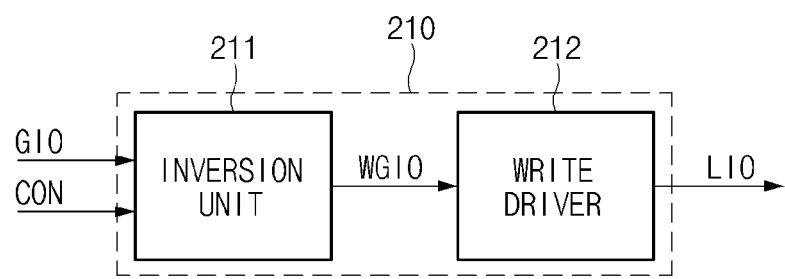
FIG. 3 is a detailed circuit diagram illustrating a local input/output (I/O) line driver shown in FIG. 1.

FIG. 3 is a detailed circuit diagram illustrating theLIO (I/O) line driver 210 shown in FIG. 1.

Referring to FIG. 3, the LIO line driver 210 may include an inversion unit 211 and a write driver 212. As shown here, the inversion unit 211 may selectively invert data received from the GIO line in response to the control signal (CON) from the inversion processor 300, such that the inversion unit 211 may output write data (WGIO). The write driver 212 may drive the write data (WGIO) and output the driven write data (WGIO) to the LIO line.

For example, it is assumed that target data to be stored in a memory cell (C) is denoted by "11111000". As shown here, the number of high data pieces (data "1") is higher than the number of low data pieces (data "0"), thus resulting in increased current consumption.

Accordingly, it is assumed that inversion data "00000111" is input to the data pad 10 (as shown in FIG. 1) and the data "00000111" is transferred to the GIO line. Thus, assuming that the control signal (CON) indicates inversion of the above data, the inversion unit 211 inverts the data "00000111" to generate recovery data "11111000". Although data of the embodiment as shown here is denoted by 8 bits for convenience of description and to provide a better understanding of the present invention, the size of data may be changed according to a data specification. Thus, the example of a data size of 8 bits should not be construed as limiting.

Referring to FIGS. 1-3, assuming that the mat information (HMAT) is at a low voltage level, the combination unit 330 indicates non-inversion of data, so that the combination unit 330 may output the inversion control signal (HDBI) as a control signal (CON) without change. On the contrary, assuming that the mat information (HMAT) is at a high voltage level, the combination unit 330 indicates inversion of data, so that the inversion control signal (HDBI) is inverted and output as a control signal (CON).

As shown in FIG. 3, the write driver 212 may drive this recovery data and output the recovery data to the LIO line. As shown in FIG. 1, data of the LIO line is applied to the memory cell (C) of the memory bank 200 (as shown in FIG. 1) through bit lines, such that the LIO line data is written in the memory cell (C).

Recently, the data processing speeds of the central processing unit (CPU) and the graphic processing unit (GPU) are gradually improving. As a result, the semiconductor memory device configured to operate at a high frequency, as often associated with the improved data processing speeds discussed above, has become very important.

However, unexpected noise of data may occur in the semiconductor memory device configured to operate at a high frequency band, such that performance or throughput of the semiconductor memory device may deteriorate due to the occurrence of data noise. To better address such an unwanted deterioration of semiconductor memory device performance as so described, the strength of the data driver may be increased or the semiconductor device may be designed in consideration of a clock margin. As a result, the number of data switching times may also increase in a high frequency regionin tandem with the increased strength of the data driver, for example, such that noise and malfunction may unavoidably occur.

Accordingly, the data bus inversion (DBI) scheme capable of minimizing the number of data switching times has been introduced. A Write Data Bus Inversion (WDBI) function may minimize the degree of data change when receiving the data from the memory controller (also called a chipset), resulting in reduction of Simultaneous Switching Output (SSO) noise.

The DBI scheme may determine how many data pieces from among data of a predetermined number of bits (e.g., data of 8 bits) occur in the flow of current in a transistor of the data buffer 110. If there are a large number of data pieces where each data piece has a logic value causing the flow of current, the logic value of each data piece is inverted to reduce the amount of current consumption.

As described above, DBI technologies have been widely used in various technical fields to reduce the amount of current consumption caused by a transfer line. For example, according to the LPDDR4 specification of the embodiment, a higher current is consumed for the transmission of a high voltage level signal when compared to the transmission of a low voltage level signal.

Therefore, given that the number of high voltage level data pieces from among transmission (Tx) data pieces is greater than the number of low voltage level data pieces, the corresponding data is inverted by the inversion unit 211 (as shown in FIG. 3). In addition, the inversion processor 300 may transmit a control signal (CON) indicating inversion or non-inversion of data to the GIO line driver 210.

The GIO line driver 210 configured to receive such data receives the control signal (CON) to decide inversion or non-inversion of data. If the data is inverted, the received data is inverted again to recover original data.

The above-mentioned embodiment is intended to serve as a non-limiting example of where data may be inverted when the number of the high voltage level data pieces is greater than the number of low voltage level data pieces. Similarly, the embodiment provides an analogous example where data may not be inverted, e.g. remain constant, in instances when the number of the high voltage level data pieces is not greater than the number of low voltage level data pieces. In addition, various other embodiments may include that discussed here without departing from the scope and spirit of the invention.

Figure 4:
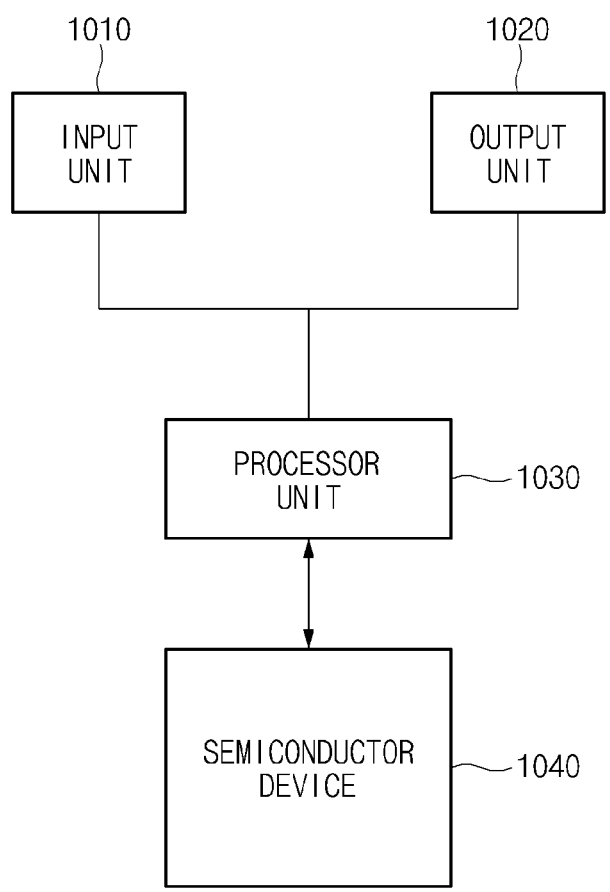
FIG. 4 is a block diagram illustrating an application example of an electronic system including the semiconductor device according to an embodiment.

FIG. 4 is a block diagram illustrating an application example of an electronic system including the semiconductor device according to the embodiment.

Referring to FIG. 4, the electronic system 1000 may include an input unit 1010, an output unit 1020, a processor unit 1030, and a semiconductor device 1040. As shown here, the processor unit 1030 may control the input unit 1010, the output unit 1020, and the semiconductor device 1040 through the corresponding interfaces.

The processor unit 1030 may include at least any one of at least one microprocessor, at least one digital signal processor, at least one microcontroller, and at least one logic circuit capable of performing identicalor similar functions as these components. Thus, the processor unit 1030 may correspond to the memory controller of the present embodiment for providing the data (i.e. DQ). The input unit 1010 may include at least one of the following devices, selected from a keyboard, a mouse, a keypad, a touchscreen, a scanner, and so forth. The output unit 1020 may include at least one of the following devices selected from a monitor, a speaker, a printer, a display device, and so forth. The semiconductor device 1040 may include the above-mentioned semiconductor device described in the aforementioned embodiment.

Figure 5:
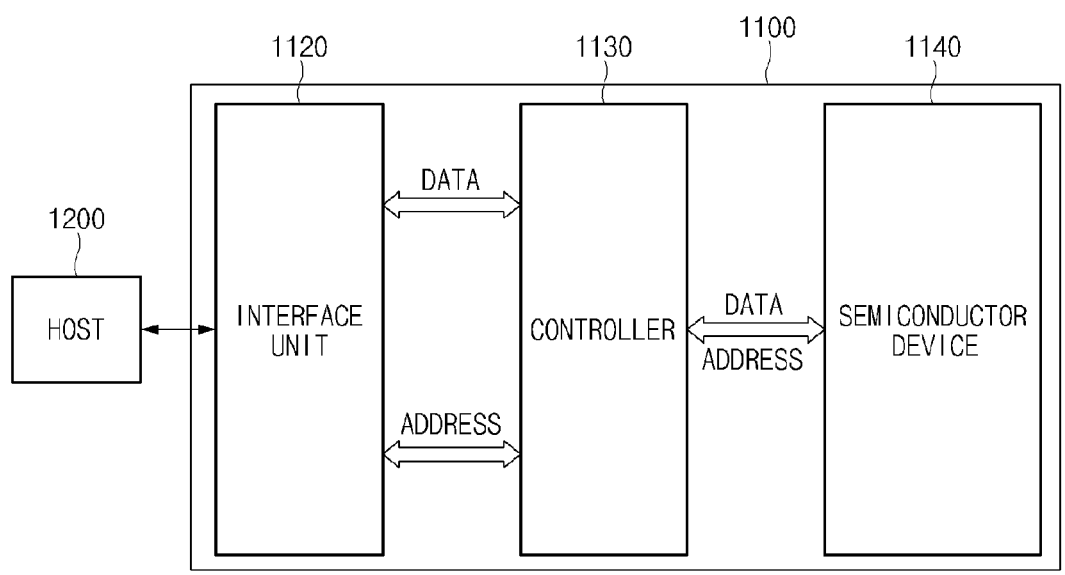
FIG. 5 is a block diagram illustrating a memory system using the semiconductor device according to an embodiment.

FIG. 5 is a block diagram illustrating a memory system using the semiconductor device according to the embodiment.

Referring to FIG. 4, the memory system 1100 may include a semiconductor device 1140, an interface unit 1120, and a controller 1130.

The interface unit 1120 may provide interfacing between the memory system 1100 and the host 1200. The interface unit 1120 may include a data exchange protocol corresponding to the host 1200 to interface with the host 1200.

The interface unit 1120 may be configured to communicate with the host 1200 through one of several various interface protocols such as, for example, a Universal Serial Bus (USB) protocol, a Multimedia Card (MMC) protocol, a Peripheral Component Interconnect-Express (PCI-E) protocol, a Serial Attached SCSI (SAS) protocol, a Serial Advanced Technology Attachment (SATA) protocol, a Parallel Advanced Technology Attachment (PATA) protocol, a Small Computer System Interface (SCSI) protocol, an Enhanced Small Disk Interface (ESDI), and an Integrated Drive Electronics (IDE) protocol.

The controller 1130 may receive data and address information from an external part through the interface unit 1120. The controller 1130 may access the semiconductor device 1110 by referring to the data and address information received from the host 1200. The controller 1130 may transfer data read from the semiconductor device 1110 to the host 1200 through the interface unit 1120.

The semiconductor device 1140 may be any one of the semiconductor devices shown in FIGS. 1 to 3. The semiconductor device 1110 may be used as a storage medium of the memory system 1100.

The memory system 1100 shown in FIG. 5 may be mounted to information processing devices, for example, a personal digital assistant (PDA), a portable computer, a web tablet, a digital camera, a portable media player (PMP), a mobile phone, a wireless phone, a laptop computer, etc. The memory system 1100 may be any of, for example, a multimedia card (MMC), a Secure Digital (SD) card, a micro SD card, a memory stick, an ID card, a Personal Computer Memory Card International Association (PCMCIA) card, a chip card, a USB card, a smart card), a Compact Flash (CF) Card, etc.

The above-mentioned description has disclosed a detailed explanation of the various embodiments of the invention. For reference, the embodiments presented may include additional structures to provide a better understanding of the invention as may be necessary. Such additional structures may not always be directly associated with technical ideas of the present invention. In addition, the high or low constructions for indicating activation states of a signal and circuit may be further modified according to the embodiment. The above-mentioned circuit modification may be frequently generated to produce a a high number of cases. Further, the discussed modification may be recognized and understood by those skilled in the art. Accordingly, a further detailed description thereof is omitted for brevity.

As may be apparent from the above description, the semiconductor device according to the embodiment can reduce a GIO toggle current generated by data bus inversion (DBI).

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

The invention claimed is:

1. A semiconductor device comprising:
   a local input/output (LIO) line driver configured to perform inversion or non-inversion of a data of a global input/output (GIO) line according to a control signal and to output the inversion or non-inversion result to the LIO line; and
   an inversion processor configured to combine an inversion control signal and mat information and to output the control signal for controlling inversion or non-inversion of the data to the LIO line driver,
   wherein the inversion processor comprises:
   a mat information processor configured to output the mat information in response to a row address; and
   a combination unit configured to combine the inversion control signal and the mat information so as to output the control signal.

2. The semiconductor device according to claim 1, wherein the inversion processor comprises:
   a data inversion controller configured to receive and buffer data inversion information and to output the inversion control signal.

3. The semiconductor device according to claim 2, wherein the data inversion controller includes:
   an inversion pad configured to receive the data inversion information; and
   a data bus inversion (DBI) buffer configured to buffer inversion data received from the inversion pad, and output the inversion control signal.

4. The semiconductor device according to claim 2, wherein the combination unit includes a logic operation element configured to perform a logic operation between the inversion control signal and the mat information.

5. The semiconductor device according to claim 4, wherein the logic operation element includes:
   an exclusive-OR (XOR) gate configured to perform an XOR operation between the inversion control signal and the mat information.

6. The semiconductor device according to claim 4, wherein the combination unit performs a non-inversion of the inversion control signal when the mat information is at a low level to output the non-inversion result as the control signal and further wherein the combination unit performs an inversion of the inversion control signal when the mat information is at a high level to output the inversion result as the control signal.

7. The semiconductor device according to claim 1, wherein the local input/output (LIO) line driver further comprises:
   an inversion unit configured to invert data received from the global input/output (GIO) line according to the control signal; and
   a write driver configured to drive an output signal of the inversion unit and to output the driven result to the LIO line.

8. The semiconductor device according to claim 1, further comprising:
   a data pad configured to receive data from an external device.

9. The semiconductor device according to claim 8, wherein:
if the number of high voltage level data from among write data is higher than the number of low voltage level data, the data is inverted and then input to the data pad.

10. The semiconductor device according to claim 8, further comprising:
a buffer configured to buffer data received from the data pad.

11. The semiconductor device according to claim 10, further comprising:
a global input/output (GIO) line driver configured to drive output data of the buffer and to output the driven result to the GIO line.

12. The semiconductor device according to claim 1, further comprising:
a core region configured to store data received through the local input/output (GIO) line.

13. A memory system comprising:
a controller configured to provide data and address information for an inversion of a data bus; and
a semiconductor device,
wherein the semiconductor device includes:
a local input/output (LIO) line driver configured to perform inversion or non-inversion of data of a global input/output (GIO) line according to a control signal and to output the inversion or non-inversion result to the LIO line; and
an inversion processor configured to combine an inversion control signal and mat information and to output the control signal for controlling inversion or non-inversion of data to the LIO line driver,
wherein the inversion processor includes:
a mat information processor configured to output the mat information in response to a row address received from the controller; and
a combination unit configured to combine the inversion control signal and the mat information so as to output the control signal.

14. The memory system according to claim 13, further comprising:

an interface unit configured to perform interfacing between the controller and an external host.

15. The memory system according to claim 13, wherein the inversion processor includes:
a data inversion controller configured to receive and buffer data inversion information from the controller and to output the inversion control signal.

16. The memory system according to claim 15, wherein the data inversion controller further comprises:
an inversion pad configured to receive the data inversion information; and
a data bus inversion (DBI) buffer configured to buffer inversion data received from the inversion pad and to output the inversion control signal.

17. The memory system according to claim 15, wherein the combination unit performs a non-inversion of the inversion control signal when the mat information is at a low level to output the non-inversion result as the control signal and performs inversion of the inversion control signal when the mat information is at a high level to output the inversion result as the control signal.

18. The memory system according to claim 13, wherein the local input/output (LIO) line driver further comprises:
an inversion unit configured to invert data received from the global input/output (GIO) line according to the control signal; and
a write driver configured to drive an output signal of the inversion unit and to output the driven result to the LIO line.

19. The memory system according to claim 13, wherein the semiconductor device further comprises:
a data pad configured to receive data from the controller;
a buffer configured to buffer data received from the data pad;
a global input/output (GIO) line driver configured to drive output data of the buffer and to output the driven resultant data to the GIO line; and
a core region configured to store data received through the local input/output (LIO) line.

* * * * *